United States Patent
Guo et al.

(10) Patent No.: US 9,252,808 B1
(45) Date of Patent: Feb. 2, 2016

(54) PING-PONG RUN LENGTH LIMIT ENCODER

(71) Applicant: Avago Technologies General IP (Singapore) Pte. Ltd., Singapore (SG)

(72) Inventors: Xiangdong Guo, Shanghai (CN); Zhiwei Wu, Shanghai (CN); Zhi Bin Li, Shanghai (CN); Yao Zhao, Shanghai (CN); Rui Shen, Shanghai (CN)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/471,427

(22) Filed: Aug. 28, 2014

(51) Int. Cl.
*H03M 7/00* (2006.01)
*H03M 7/46* (2006.01)

(52) U.S. Cl.
CPC ...................... *H03M 7/46* (2013.01)

(58) Field of Classification Search
CPC ......... H03M 7/46; H03M 5/14; H03M 5/145; G11B 20/1426; G11B 20/10; G11B 20/14; G11B 20/18; G11B 20/1258
USPC ...................................................... 341/55–95
See application file for complete search history.

(56) References Cited

U.S. PATENT DOCUMENTS

| | | | |
|---|---|---|---|
| 5,345,342 A | 9/1994 | Abbott et al. | |
| 5,475,388 A * | 12/1995 | Gormish | G06T 9/005 341/106 |
| 5,739,779 A * | 4/1998 | Kunisa | H03M 5/145 341/106 |
| 6,052,072 A * | 4/2000 | Tsang | H03M 7/46 341/50 |
| 6,516,443 B1 * | 2/2003 | Zook | G11B 20/10009 714/792 |
| 6,702,718 B2 * | 3/2004 | Tani | F02D 41/042 477/203 |
| 6,897,793 B1 * | 5/2005 | Kim | H03M 5/145 341/50 |
| 8,797,668 B1 * | 8/2014 | Grinchuk | H03M 13/1102 360/46 |
| 2009/0027242 A1 | 1/2009 | Cideciyan et al. | |

* cited by examiner

*Primary Examiner* — Lam T Mai

(57) ABSTRACT

A run length limit encoder includes a subdivided threshold lookup table to encode data using multi-level enumeration.

20 Claims, 4 Drawing Sheets

PING-PONG RUN LENGTH LIMIT ENCODER

FIELD OF THE INVENTION

Various embodiments of the present invention provide systems and methods for run length limit encoding.

BACKGROUND

Various products including hard disk drives and transmission systems utilize a read channel device to encode data, store or transmit the encoded data on a medium, retrieve the encoded data from the medium and decode and convert the information to a digital data format. Such read channel devices may include data processing circuits including encoder and decoder circuits to encode and decode data as it is stored and retrieved from a medium or transmitted through a data channel, in order to reduce the likelihood of errors in the retrieved data. It is important that the read channel devices be able to rapidly and accurately decode the original stored data patterns in retrieved or received data samples.

The encoded data can be constrained to follow one or more rules that reduce the chance of errors. For example, when storing data on a hard disk drive, it can be beneficial to avoid long runs of consecutive transitions, or long runs of 0's or 1's.

BRIEF SUMMARY

Various embodiments of the present invention provide systems, apparatuses and methods for run length limit (RLL) encoding for constrained systems. In some embodiments, a storage system includes a storage medium operable to maintain a data set, a read/write head assembly operable to write the data set to the storage medium and to read the data set from the storage medium, and a run length limit encoder with a subdivided threshold lookup table including a number of subordinate threshold lookup tables, each operable to yield a threshold indexed by a different iteration number, to encode the data set before it is written to the storage medium as encoded data.

In some embodiments, the run length limit encoder includes multiple encode engines that share the subdivided threshold lookup table.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components.

DETAILED DESCRIPTION OF THE INVENTION

Embodiments of the present invention are related to run length limit encoding using multi-level enumeration, using a subdivided threshold lookup table, each indexed with a different iteration number (or with a different index number derived from a common iteration number). In some embodiments, multiple encode engines share the subdivided threshold lookup table in ping-pong fashion, enabling multiple different data blocks to be encoded concurrently without duplicate lookup tables. The ping-pong structure enables multiple run length limit encode engines, each working at a fraction of the overall throughput data rate, to share one lookup table. A synchronization mechanism is provided to control the operation of the encode engines so that they operate at the same iteration number as they access the shared lookup table.

The run length limit encoded bits are statistically near-equivalent to a Markov source, such as, but not limited to, the Markov source that provides near-optimal magnetic channel performance. Combined with further encoding such as, but not limited to, low density parity check (LDPC) encoding, the encoding performance is increased and provides benefits for a number of applications including high density storage devices.

Figure 1:
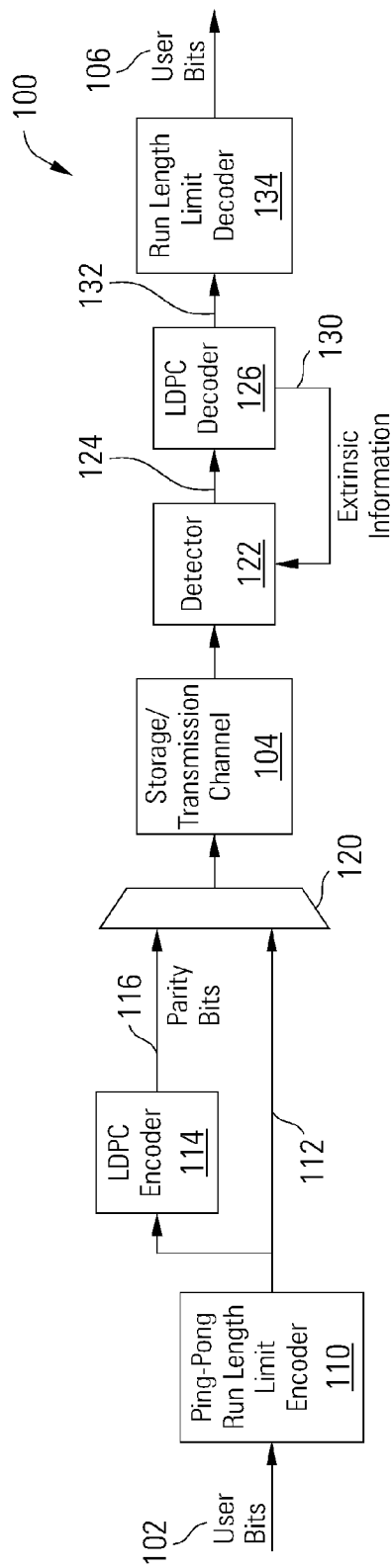
FIG. 1 depicts a block diagram of a read channel including a ping-pong run length limit encoder with multiple encode engines and a shared threshold lookup table which can be used to store and retrieve or transmit and receive data in accordance with some embodiments of the present invention.

Although the run length limit encoders with subdivided threshold lookup tables and the ping-pong run length limit encoders disclosed herein are not limited to any particular application, they can be used for example in a read channel of a storage device. Turning to FIG. 1, a read channel 100 is used to process user data bits 102, store them in or transit them through a storage or transmission channel 104 and retrieve the user data bits 106 without introducing errors. The user data bits 102 are processed in a run length limit encoder with subdivided threshold lookup tables 110. In some embodiments, the run length limit encoder with subdivided threshold lookup tables 110 includes multiple encode engines sharing the subdivided threshold lookup tables in ping-pong fashion. The run length limit encoder 110 performs modulation encoding or source encoding of user data bits 102, matching or near-matching the Markov source characteristics of the channel 104. In some embodiments, the run length limit encoder 110 applies hard constraints such as, but not limited to, maximum transition-run (MTR) and (j, k) constraints. For example, the frequency response of the read channel 100 is generally at a maximum at DC and degrades near the Nyquist frequency, particularly when the storage or transmission channel 104 is a magnetic storage device. By limiting the maximum transition run length in the encoded user bits 112, the read channel 100 operates below the Nyquist frequency and avoids errors that might be introduced by the degraded frequency response near the Nyquist frequency.

The encoded user bits 112 are provided to a low density parity check or other encoder 114, which produces parity bits 116 for the encoded user bits 112. The parity bits 116 are combined with the encoded user bits 112 in a multiplexer 120, and the resulting data is stored in or transmitted through storage or transmission channel 104.

The data is retrieved or received from the storage or transmission channel 104 and is processed in a detector 122. Additional components may be included as is known before and after the storage or transmission channel 104. For example, if the storage or transmission channel 104 is a magnetic hard disk drive, an analog front end can be included to amplify and filter an analog signal from the magnetic hard disk drive, followed by an analog to digital converter to sample the analog signal and provide a digital bit stream. Filtering components can also be included, such as a digital finite impulse response filter, to filter the signal to the detector 122.

The detector 122 can be any detector circuit known in the art including, but not limited to, a Viterbi algorithm detector circuit or a maximum a posteriori detector circuit. Based upon the disclosure provided herein, one of ordinary skill in the art will recognize a variety of detector circuits that may be used in relation to different embodiments of the present invention. Detector circuit 122 performs a data detection process on the received input from the storage or transmission channel 104 resulting in a detected output 124. The detected output 124 is provided to a decoder such as a low density parity check decoder 126 which performs parity checks on the detected output 124, ensuring that parity constraints established by the low density parity check encoder 114 are satisfied in order to detect and correct any errors that may have occurred in the data while passing through the storage or transmission channel 104 or other components of the read channel 100. Other error detection and correction encoders and decoders may be used in the read channel 100 in place of the low density parity check encoder 114 and low density parity check decoder 126, and one of ordinary skill in the art will recognize a variety of error detection and correction encoders and decoders that may be used in relation to different embodiments of the present invention. In the case of the low density parity check encoder 114 and low density parity check decoder 126, the detector 122 and low density parity check decoder 126 can operate in an iterative fashion, with extrinsic information 130 passed from the low density parity check decoder 126 to the detector 122 to aid in the data detection and parity check process. The low density parity check decoder 126 yields encoded user bits 132 retrieved from the storage or transmission channel 104, with the parity bits removed after the combination of encoded user bits and parity bits satisfy the parity check constraints.

The encoded user bits 132 from the low density parity check decoder 126 are provided to a run length limit decoder 134 which reverses the enumerative encoding performed by the run length limit encoder 110. The run length limit decoder 134 yields user data bits 106, which should be identical to user data bits 102 if the data is not corrupted in the storage or transmission channel 104 beyond the capacity of the detector 122 and low density parity check decoder 126 to correct.

The run length limit encoder 110 can be adapted to any suitable encoding rate, and in some embodiments, multiple selectable encoders can be included operating at different encoding rates, such as, but not limited to, 96/97, 144/145, 200/201, 17/18, etc. In some example embodiments disclosed herein, an encoding rate of 96/97 is used, producing 97 encoded output bits for each 96 input bits. Again, the run length limit encoder 110 finds a Markov source to achieve Shannon channel capacity of inter-symbol interference (ISI) channels and uses a cost constraint approximation for this Marko source. The input data is decomposed into bases taken from different encoding levels, and the next level is based on previous encoded results. The core encoder algorithm can be expressed as shown below in pseudo code, without describing the subdivided lookup tables for clarity in describing the encoding algorithm:

Threshold=Base_LUT[iter_$n$][level];

$Y[n]$=($X$sum>=threshold)?1:0;

level=level+delta_level_update($Y[n]$,iter_$n$);

$X$sum=$X$sum_update($Y[n],X[k]$,iter_$n$)

Where:
n: the output data sequence number, starts from 0, incremented by 1 for each encoded bit.
X[k]: the input data sequence for one sector, starting from 0;
Y[n]: the encoded output data sequence for one sector, starting from 0;
iter_n: periodic iteration number which is decremented by 1 for each bit, starting from 96, and wrapping to 96 if it is smaller than 0.
level: the level value for the current input data bit, updated after each encoded bit for the next input bit, ranging from 0 to 91.
base_LUT: the lookup table records all the thresholds used for encoded data bit calculation which depends on current iter_n and level values. In some embodiments, the threshold is 11-bit while the iter_n ranges from 0 to 96 and level ranges from 0 to 91, such that the total number of bits in the lookup table is 97*92*11 bits.
delta_level_update: The function to calculate the jump of next level based on current level, depending on Y[n] and inter_n;
Xsum_update: The function to update the Xsum used for the next encoded bit calculation, depending on Y[n], X[k], and iter_n.

As shown in the above algorithm, each encoded output bit is generated based on a lookup table search, 11-bit comparison, plus 1 addition, 7-bit addition and left shift. To maintain the same throughput as the upstream input data, this calculation would typically be performed in 1 T time period. However, using the ping-pong run length limit encoder, with two encoding engines each engine can perform the calculation in 2 T rather than 1 T, with the overall throughput remaining unchanged. Further, by sharing the lookup table among the encoding engines, the throughput can be maintained without duplicating lookup tables, greatly saving circuit area and power requirements.

Figure 2:
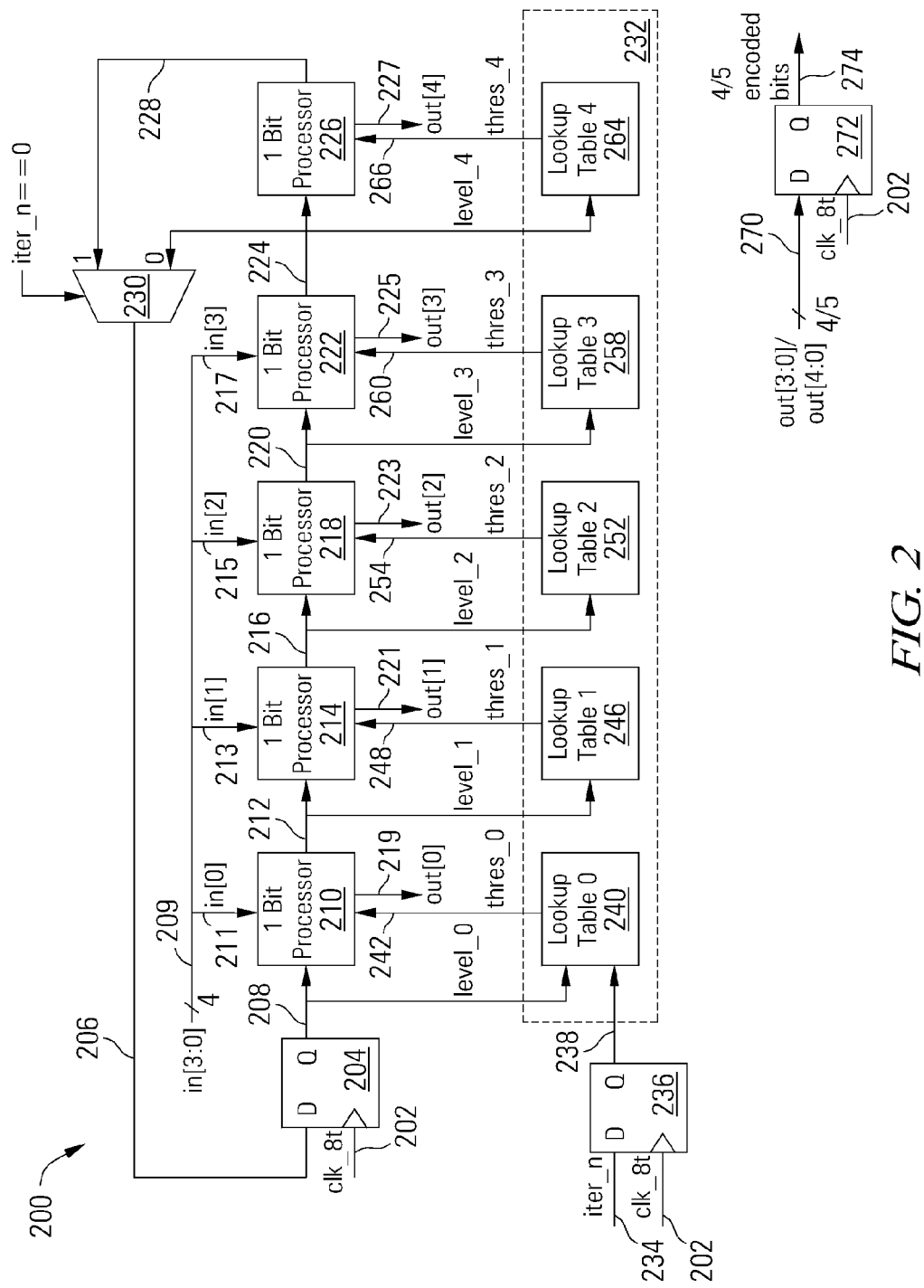
FIG. 2 depicts a block diagram of a run length limit encoder with a subdivided threshold lookup table in accordance with some embodiments of the present invention.

Turning to FIG. 2, a run length limit encoder 200 is depicted with a subdivided threshold lookup table 232 in accordance with some embodiments of the present invention. The run length limit encoder 200 performs multi-level enumerative encoding using a number of 1 bit processors 210, 214, 218 and 222 to perform an 11-bit comparison, plus 1 addition, 7-bit addition and left shift based on thresholds 242, 248, 254, 260 and 266, and to generate a parity bit with the last 1 bit processor 226 during the last 8 T cycle of the 96 T encoding period. Each of the 1 bit processors 210, 214, 218, 222 except the last 1 bit processor 226 receives one-bit input data 211, 213, 215, 217, respectively, each being one bit of four-bit data input 209. The 1 bit processors 210, 214, 218, 222 each generate a one-bit data output 219, 221, 223, 225, each being one bit of four- or five-bit encoded output 270. The fifth 1 bit processor 226 does not receive input data, and only outputs valid data at output 227 as part of encoded output 270 when the iteration number iter_n reaches 0. Thus, during all 8 T cycles but the last, four encoded data bits are generated at output 270, and during the last 8 T cycle of the 96 T encoding period, five encoded data bits are generated at output 270. Any suitable multi-level enumerative encoding circuit can be used in the 1 bit processors 210, 214, 218, 222 and 226, and one of ordinary skill in the art will recognize a variety of encoder circuits that may be used in relation to different embodiments of the present invention. The run length limit encoder 200 is not limited to any particular encoding algorithm or to any particular constraints to be applied when encoding user bits.

The thresholds 242, 248, 254, 260 and 266 are retrieved from subordinate threshold lookup tables 240, 246, 252, 258, 264, each indexed based on the iteration number and on the encoding level. In some embodiments, the subdivided threshold lookup table 232 is divided into five subordinate threshold lookup tables 240, 246, 252, 258, 264, although it can be divided into any other number of subordinate threshold lookup tables. The subordinate lookup table 0 240 records the 92*24 thresholds corresponding to all 92 possible level values and 24 possible iter_n values where the iter_n is multiple of 4, or 4 k+0. Similarly, the subordinate lookup table 1 246 records the 92*24 thresholds for all 92 possible level values and 24 possible iter_n values where the iter_n is multiple of 4 plus 1, or 4 k+1. The subordinate lookup table 2 252 records the 92*24 thresholds for all 92 possible level values and 24 possible iter_n values where the iter_n is multiple of 4 plus 2, or 4 k+2. The subordinate lookup table 3 258 records the 92*24 thresholds for all 92 possible level values and 24 possible iter_n values where the iter_n is multiple of 4 plus 3, or 4 k+3. The subordinate lookup table 4 264 is only used when iter_n is in the last 8 T clock cycle in one period of 97 T, enabling the 1 bit processor 226 to generate the 97'th output bit. With this separation or subdividing of the lookup table 232, it is possible to fetch all the four or five thresholds in one 8 T clock cycle without additional lookup table cost. In addition, the lookup table index depth is reduced from $\log_2^{92}+\log_2^{96}(14)$ to $\log_2^{92}+\log_2^{24}(12)$, which reduces the timing cost.

The iteration number iter_n 234 is initiated at a value of 96 and is decreased by 4 in each 8 T clock cycle and wrapped again to 96 when it reaches 4, enabling 4 input bits to be fed into the encode engine 200 in each 8 T clock cycle. For the 96 input bits, 97 encoded output bits are generated, with the 97$^{th}$ bit being a parity bit generated by the 1 bit processor 226 in the last 8 T clock cycle of the 96 T period.

Previous level value 206 is synchronized by D flip flop or latch 204 based on the 8 T clock 202, yielding level 208. The 1 bit processor 210 performs the encoding calculation based on the previous level 208 and on the threshold thresh_0 242 from subordinate lookup table 0 240, indexed using level_0 208 and the iteration number iter_n 234, which is a multiple of 4. The 1 bit processor 210 thus generates an updated level_1 212 based on the previous level level_0 208 and on an input data bit (not shown) to 1 bit processor 210, and generates the first encoded output bit for the 8 T cycle, shown generally as part of encoder output 270. The 1 bit processor 214 performs the encoding calculation based on the previous level level_1 212 from 1 bit processor 210 and on the threshold thresh_1 248 from subordinate lookup table 1 246, indexed using level_1 212 and the iteration number iter_n 234 plus 1. The 1 bit processor 214 thus generates an updated level level_2 216 based on the previous level level_1 212 and on an input data bit (not shown) to 1 bit processor 214, and generates the second encoded output bit for the 8 T cycle, shown generally as part of encoder output 270. The 1 bit processor 218 performs the encoding calculation based on the previous level level_2 216 from 1 bit processor 214 and on the threshold thresh_2 254 from subordinate lookup table 2 252, indexed using level_2 216 and the iteration number iter_n 234 plus 2. The 1 bit processor 218 thus generates an updated level level_3 220 based on the previous level_2 216 and on the next input data bit (not shown) to 1 bit processor 218, and generates the third encoded output bit for the 8 T cycle, shown generally as part of encoder output 270. The 1 bit processor 222 performs the encoding calculation based on the previous level level_3 220 from 1 bit processor 218 and on the threshold thresh_3 260 from subordinate lookup table 3 258, indexed using level_3 220 and the iteration number iter_n 234 plus 3. The 1 bit processor 222 thus generates an updated level level_4 224 based on the previous level_3 220 and on the next input data bit (not shown) to 1 bit processor 222, and generates the fourth encoded output bit for the 8 T cycle, shown generally as part of encoder output 270.

In all 8 T cycles but the last of the 96 T encoding period, the output 270 contains four encoded bits, generated based upon 4 successive input data bits to 1 bit processors 210, 214, 218 and 222. In the last 8 T cycle of the 96 T encoding period, a parity bit is generated by 1 bit processor 226 as a fifth output data bit in output 270. The parity bit is generated by 1 bit processor 226 based on the level_4 224 and on the threshold thresh_4 266 from subordinate lookup table 4 264, indexed using level_4 224 and an iteration number of 0.

The level 206 is obtained from multiplexer 230, selecting level_4 224 yielded by 1 bit processor 222 in all but the last 8 T cycle of the 96 T encoding period, and selecting the level 228 generated by 1 bit processor 226 during the last 8 T cycle of the 96 T encoding period.

In some embodiments, the iteration number iter_n 234 is synchronized or latched by D flip flop or latch 236 based on the 8 T clock 202, yielding synchronized iteration number iter_n 238. Similarly, in some embodiments, the output 270 is latched by D flip flop or latch 272 based on the 8 T clock 202, yielding output 274, which is either four or five bits per 8 T period as described above.

The throughput of encoder 200 is thus four data bits per 8 T time period. The overall throughput of the encoding system can be increased by including multiple encode engines sharing one subdivided threshold lookup table.

Figure 3:
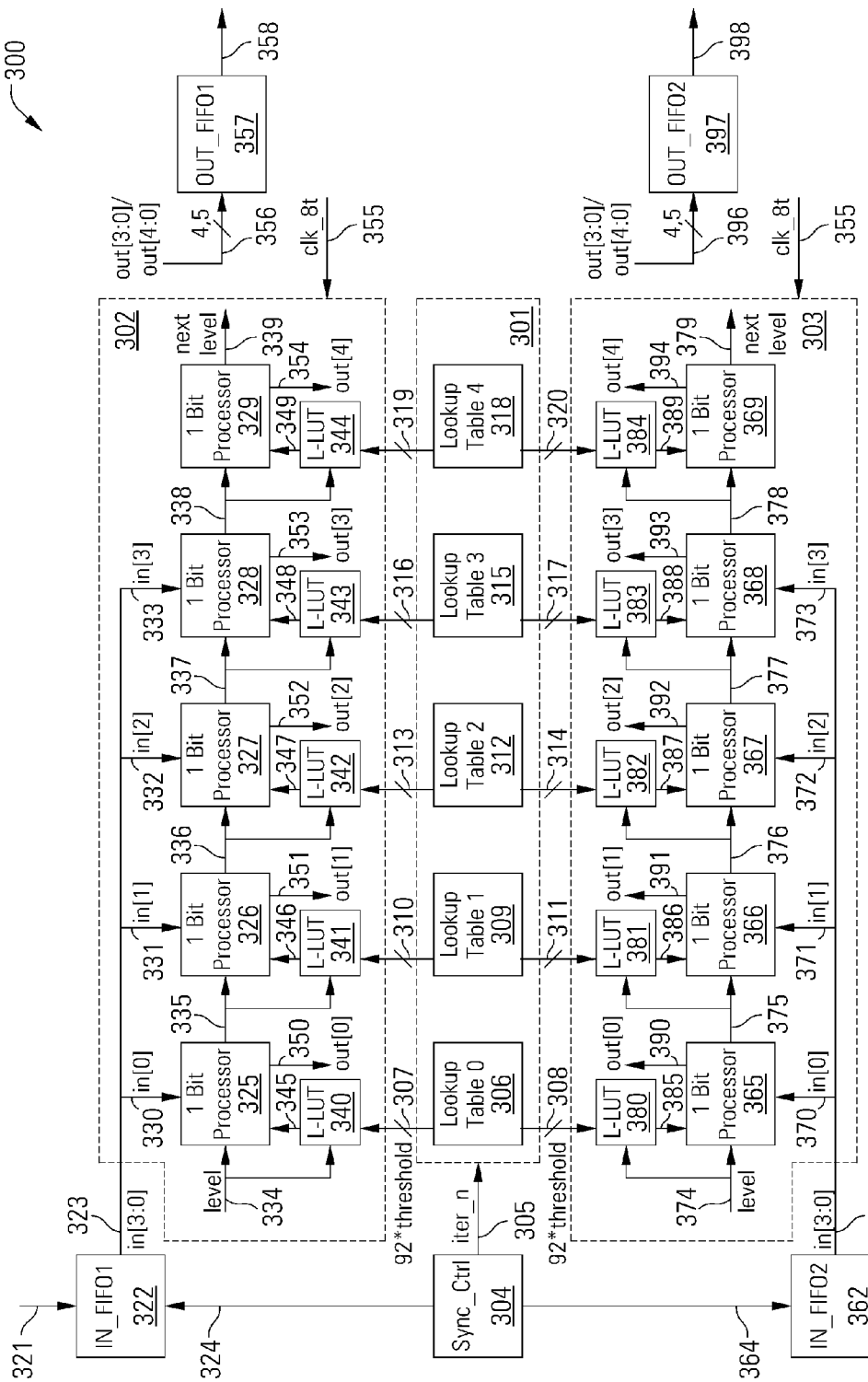
FIG. 3 depicts a block diagram of a ping-pong run length limit encoder with multiple encode engines sharing a subdivided threshold lookup table in accordance with some embodiments of the present invention.

Turning to FIG. 3, a ping-pong run length limit encoder 300 is depicted with multiple encode engines 302, 303 sharing a subdivided threshold lookup table 301 in accordance with some embodiments of the present invention. The thresholds 345, 346, 347, 348, 349 used by encode engine 302 and 385, 386, 387, 388, 389 used by encode engine 303 are dependent on both iteration number iter_n 305 and on the current encoding level of the multi-level enumerative encoding. In some embodiments, the lookup table functions are divided, maintaining the iteration number-dependent value lookup in the shared portion of the subdivided threshold lookup table 301, with the level-dependent value lookup being moved into the encode engines 302, 303 in level lookup tables 340, 341, 342, 343, 344, 380, 381, 382, 383, 384. This allows each encode engine 302, 303 to operate at different encoder state levels depending on the input data values, while sharing the subdivided threshold lookup table 301 and operating at the same iteration number iter_n 305.

In some embodiments, the encode engines 302, 303 have the same interfaces, function and throughput, with the throughput for each being four data bits per 8 T time period. The overall throughput is thus eight data bits per 8 T time period. Each of the encode engines 302, 303 can encode different data blocks or data sectors at inputs 321, 361, such that the ping-pong run length limit encoder 300 concurrently encodes multiple different data sectors. Input and output first-in first-out (FIFO) memories 322, 362, 357, 397 can be provided to ensure the continuous data output to downstream system components such as the low density parity check encoder, and to avoid interrupting the data stream from upstream components.

During operation, for example, a first data sector to be encoded passes through input FIFO 1 322 and is encoded by encode engine 302, passes through output FIFO 1 357 and on to downstream components. If the next data sector is received while the first data sector is not yet fully encoded by encode engine 302, an input multiplexer (not shown) switches the input data to input FIFO 2 362, and it is encoded by encode engine 303, passes through output FIFO 2 397 and on to downstream components. The subdivided threshold lookup table 301 is shared in ping-pong fashion by encode engines 302, 303 during this encoding process.

A synchronization controller circuit 304 controls the encoding process, allowing data to flow from input FIFOs 322, 362 to encode engines 302, 303 only when both encode engines 302, 303 are encoding at the same iteration number. The subdivided threshold lookup table 301 can thus be indexed by the same iteration number, appropriate for both encode engines 302, 303. If data availability causes the encode engines 302, 303 to be at different iteration numbers, one of them is stalled by the synchronization controller circuit 304, and data is prevented from passing from the input FIFO 322 or 362 to the stalled encode engine 302 or 303. When the non-stalled encode engine 302 or 303 has reached the iteration number of the stalled encode engine 302 or 303, the synchronization controller circuit 304 again allows data to flow from both input FIFOs 322, 362 to encode engines 302, 303. Thus, only one lookup table is needed for multiple encode engines, and the overall throughput is increased without increasing the circuit size and power consumption as a multiple of the number of encode engines.

Encode engine 302 receives input data 323 from input FIFO 322 (buffered from switched input 321) and encodes the input data and updates encoding levels as described above with respect to FIG. 2, based on thresholds 345, 346, 347, 348, 349. Iteration number-dependent values 307, 310, 313, 316, 319 are retrieved from the subdivided threshold lookup table 301 based on the common iteration number iter_n 305. Level-dependent thresholds 345, 346, 347, 348, 349 are retrieved from level-dependent lookup tables 340, 341, 342, 343, 344 based on the iteration number-dependent values 307, 310, 313, 316, 319 and on the level values 334, 335, 336, 337, 338. (Level 334 is derived from the next level value 339 from the previous 8 T cycle.) During each 8 T encoding cycle, four input bits 330, 331, 332, 333 from data input 323 are processed by 1 bit processors 325, 326, 327, 328, updating the level and yielding output data bits 350, 351, 352, 353. Again, the final 1 bit processor 329 generates a parity bit 354 during the final 8 T cycle of the 96 T encoding period. Thus, the encoded output 356 of encoding engine 302 for an 8 T cycle is four bits in all but the final 8 T cycle, when it is five bits. The four- or five-bit output 356 is provided to output FIFO 357, which yields buffered encoded output 358.

Encode engine 303 receives input data 363 from input FIFO 362 (buffered from switched input 361) and encodes the input data and updates encoding levels as described above with respect to FIG. 2, based on thresholds 385, 386, 387, 388, 389. Iteration number-dependent values 308, 311, 314, 317, 320 are retrieved from the subdivided threshold lookup table 301 based on the common iteration number iter_n 305. Level-dependent thresholds 385, 386, 387, 388, 389 are retrieved from level-dependent lookup tables 380, 381, 382, 383, 384 based on the iteration number-dependent values 308, 311, 314, 317, 320 and on the level values 374, 375, 376, 377, 378. (Level 374 is derived from the next level value 379 from the previous 8 T cycle.) The 92 possible thresholds are thus retrieved from the subdivided threshold lookup table 301 and provided to each encode engine 302, 303. The level value in each encode engine 302, 303 is updated independently and is used to fetch the thresholds 345, 346, 347, 348, 349, 385, 386, 387, 388, 389 from level lookup tables 340, 3411, 342, 343, 344, 380, 381, 382, 383, 384. During each 8 T encoding cycle, four input bits 370, 371, 372, 373 from data input 323 are processed by 1 bit processors 365, 366, 367, 368, updating the level and yielding output data bits 390, 391, 392, 393. Again, the final 1 bit processor 369 generates a parity bit 394 during the final 8 T cycle of the 96 T encoding period. Thus, the encoded output 396 of encoding engine 303 for an 8 T cycle is four bits in all but the final 8 T cycle, when it is five bits. The four- or five-bit output 396 is provided to output FIFO 397, which yields buffered encoded output 398.

Figure 4:
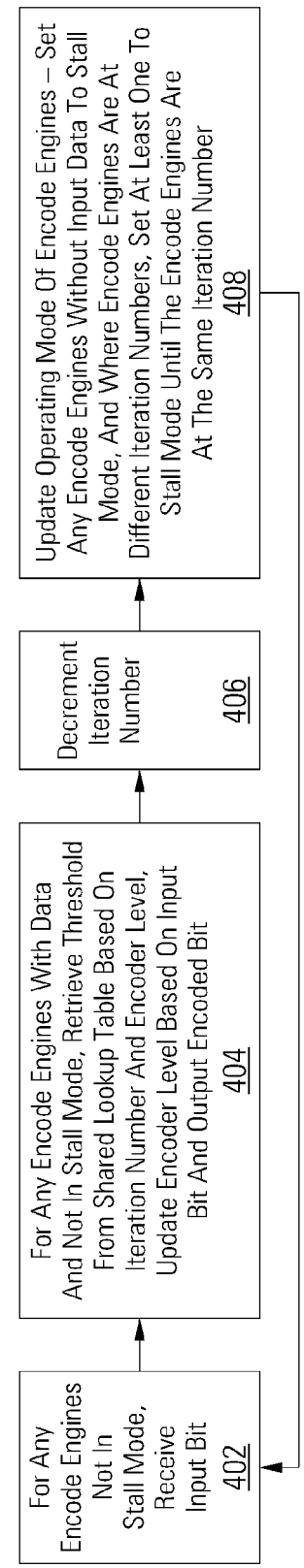
FIG. 4 depicts a flow diagram showing a method for ping-pong run length limit encoding to encode multiple blocks of data using a shared subdivided threshold lookup table in accordance with some embodiments of the present invention.

Turning to FIG. 4, a method for ping-pong run length limit encoding to encode multiple blocks of data using a shared subdivided threshold lookup table is shown in flowchart 400 in accordance with some embodiments of the present invention. Following flowchart 400, any encode engines not in stall mode receive an input bit. (Block 402) For any encode engines with data and not in stall mode, thresholds are retrieved from a shared lookup table based on the iteration number and encoder level, the encoder level is updated based on the input bit and the encoded bit is output. (Block 404) The iteration number is decremented. (Block 406) In some embodiments, an equivalent encoding algorithm increments the iteration numbers rather than decrementing, wrapping the iteration number appropriately. The operating mode of the encode engines is updated based on whether they share the same iteration number. (Block 408) Any encode engines without input data are set to stall mode. Where engines are at different iteration numbers, at least one of the encode engines is sets to stall mode until the encode engines are again at the same iteration number.

The synchronization controller circuit 304 tracks the current iteration numbers for each encoder engine 302, 303 and determines which encode engine 302 or 303 should continue processing or stall to wait for another encode engine 302 or 303 to ensure that both encode engines 302, 303 work in the same drum points. When the encode engines 302, 303 work in the same drum points, the same iteration number is used for both encode engines 302, 303 and the pre-fetched thresholds from subordinate threshold lookup tables 306, 309, 312, 315, 318 can be used for both engines. The drum point is checked if one encode engine 302 or 303 is started to work from idle or stop state. The drum point ranges from 0 to 96 and is set by the iteration number of the encode engine 302 or 303 which is stopped, as set forth below.

In a single encode engine mode, if only one data sector is being encoded, then only one encode engine 302 or 303 is active. The synchronization controller circuit 304 continuously updates the iteration number iter_n for each cycle as long as the input FIFO 322 or 342 is not empty.

In multiple encode engine modes, when a second data sector is received for encoding while the first data sector has not been fully encoded by the first encode engine 302, the second data sector is buffered into an input FIFO and the second encode engine 303 stalls while encode engine 302 continues to encode the first data sector. As the initial iteration number for the second encode engine 303 is 96, the drum point is set to 96. The second encode engine 303 is not started to encode the second data sector until the iteration number iter_n reaches 96. After that, both encode engines 302, 303 work to encode the different first and second data sectors.

If the upstream data for the second data sector is stopped or interrupted, the second encode engine 303 is stalled when the input FIFO 342 is empty. As an example, if iteration number iter_n is 60 when the second encode engine 303 stalls, the drum point is set to 60. Encode engine 302 continuously operates and iteration number iter_n is cyclically decremented as described above. After some time, if the upstream data for the second data sector begins to arrive again, the second encode engine 303 remains stalled until the iteration number iter_n reaches the drum point, which in this example is set to 60.

In the worst case, the second encode engine 303 remains stalled for a maximum restart latency of 184 T even when the input FIFO 342 has data available to encode. The 184 T is referred to as a restart latency because the iteration number iter_n is decreased by 4 in every 8 T clock cycle. The derivation of the maximum restart latency can be shown by an example in which, again, the drum point is set to 60. If the iteration number iter_n is 56 when encode engine 303 again has enough data from input FIFO 342, encode engine 303 remains stalled to wait until the iteration number iter_n reaches the drum point. The iteration number iter_n goes through 56→52→48→ . . . →4→96→92→88→ . . . →64→60. The number of cycles for encode engine 303 to be stalled is 23, with 8 T per cycle. The maximum restart latency is thus 23*8 or 184 T.

To reduce the maximum restart latency which is up to 184 T, either encode engine can be started if data is available to both encode engines 302, 303 and a smaller restart latency can be identified by changing which of the encode engines 302, 303 is stalled. For the example above, if data is available to encode engine 303 from input FIFO 342, encode engine 303 can be allowed to operate immediately with encode engine 302 stalled while the drum point is set to 56. In the next 8 T clock cycle, the iteration number iter_n for encode engine 303 reaches 56 which is the drum point. At this point, both encode engines 302, 303 can operate in parallel to provide full data throughput. The restart latency is thus reduced from 184 T to 8 T.

With this determination of which encode engine to stall, the maximum restart latency is reduced from 184 T to 96 T. The maximum restart latency occurs when the distance from the current iteration number iter_n to the drum point is 48. For the example given above, where the drum point is set to 60, if the current iteration number iter_n for encode engine 302 is 12, there are two options to synchronize the encode engines 302, 303. In a first option, the encode engine 303 is stalled and the iteration number iter_n for encode engine 302 continues to change as encoding progresses in encode engine 302. The encode engine 303 is restarted and the encode engines 302, 303 operate in parallel when the current iteration number iter_n for encode engine 302 reaches 60, so the latency is 12*8 or 96 T. In a second option, the encode engine 302 is stalled and the iteration number iter_n for encode engine 303 continues to change as encoding progresses in encode engine 303, running through the sequence 60→56→52→48→ . . . →16→12. The encode engine 302 is restarted and the encode engines 302, 303 operate in parallel when the current iteration number iter_n for encode engine 303 reaches 12, so the latency is 12*8 or 96 T. In this example, the restart latencies are the same for either option, being the maximum restart latency of 96 T. In other examples, one option will have a lower restart latency than the other.

The full data throughput of 1 bit input data per T is supported by the ping-pong structure. As there are 97 encoded output bits for every 96 input data bits, the extra 1 bit output can be used to compensate the gap in the encoded data output caused by restart latency to support back-to-back sector writes.

Figure 5:
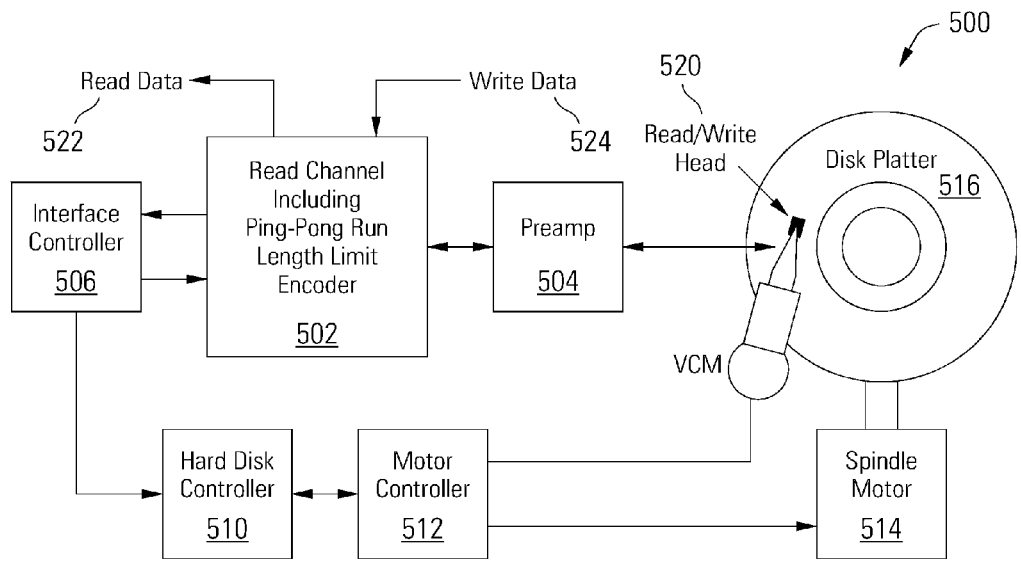
FIG. 5 depicts a storage system including a read channel with a ping-pong run length limit encoder in accordance with some embodiments of the present invention.

Turning to FIG. 5, a storage system 500 is illustrated as an example application of a ping-pong run length limit encoder in accordance with some embodiments of the present invention. The storage system 500 includes a read channel circuit 502 with a ping-pong run length limit encoder in accordance with one or more embodiments of the present invention. Storage system 500 may be, for example, a hard disk drive. Storage system 500 also includes a preamplifier 504, an interface controller 506, a hard disk controller 510, a motor controller 512, a spindle motor 514, a disk platter 516, and a read/write head assembly 520. Interface controller 506 controls addressing and timing of data to/from disk platter 516. The data on disk platter 516 consists of groups of magnetic signals that may be detected by read/write head assembly 520 when the assembly is properly positioned over disk platter 516. In one embodiment, disk platter 516 includes magnetic signals recorded in accordance with either a longitudinal or a perpendicular recording scheme.

In a typical read operation, read/write head assembly 520 is accurately positioned by motor controller 512 over a desired data track on disk platter 516. Motor controller 512 both positions read/write head assembly 520 in relation to disk platter 516 and drives spindle motor 514 by moving read/write head assembly 520 to the proper data track on disk platter 516 under the direction of hard disk controller 510. Spindle motor 514 spins disk platter 516 at a determined spin rate (RPMs). Once read/write head assembly 520 is positioned adjacent the proper data track, data encoded by ping-pong run length limit encoder and processed as desired by other components is written to the disk platter 516 as disk platter 516 is rotated by spindle motor 514. During a read operation, magnetic signals representing data on disk platter 516 are sensed by read/write head assembly 520 as disk platter 516 is rotated by spindle motor 514. The sensed magnetic signals are provided as a continuous, minute analog signal representative of the magnetic data on disk platter 516. This minute analog signal is transferred from read/write head assembly 520 to read channel circuit 502 via preamplifier 504. Preamplifier 504 is operable to amplify the minute analog signals accessed from disk platter 516. In turn, read channel circuit 502 digitizes and decodes the received analog signal to recreate the information originally written to disk platter 516. This data is provided as read data 522 to a receiving circuit. While processing the read data, read channel circuit 502 decodes the read data to detect and correct errors, including decoding to reverse previous run length limit encoding. Such run length limit encoding can be implemented consistent with the disclosure above in relation to FIGS. 1-3. In some embodiments, the run length limit encoding can be performed consistent with a process disclosed above in relation to FIG. 4.

It should be noted that storage system 500 can be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 500 can be modified to include solid state memory that is used to store data in addition to the storage offered by disk platter 516. This solid state memory may be used in parallel to disk platter 516 to provide additional storage. In such a case, the solid state memory receives and provides information directly to read channel circuit 502. Alternatively, the solid state memory can be used as a cache where it offers faster access time than that offered by disk platter 516. In such a case, the solid state memory can be disposed between interface controller 506 and read channel circuit 502 where it operates as a pass through to disk platter 516 when requested data is not available in the solid state memory or when the solid state memory does not have sufficient storage to hold a newly written data set. Based upon the disclosure provided herein, one of ordinary skill in the art will recognize a variety of storage systems including both disk platter 516 and a solid state memory.

Figure 6:
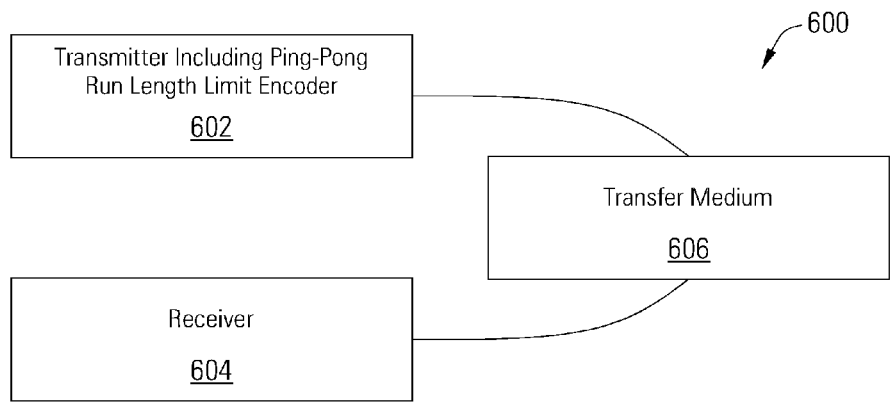
FIG. 6 depicts a wireless communication system including a ping-pong run length limit encoder in accordance with some embodiments of the present invention.

Turning to FIG. 6, a wireless communication system 600 or data transmission device including a transmitter 602 with a ping-pong run length limit encoder and a receiver 604 is shown in accordance with some embodiments of the present invention. The transmitter 602 is operable to perform modulation encoding of data using ping-pong run length limit encoding to approach the Markov source characteristics of the wireless channel or transfer medium 606. Such run length limit encoding can be implemented consistent with the disclosure above in relation to FIGS. 1-3. In some embodiments, the run length limit encoding can be performed consistent with a process disclosed above in relation to FIG. 4. In some cases, the data is further encoded to provide error correction capability before transmission.

The encoded information is transmitted via a transfer medium 606 as is known in the art. The encoded data is received from transfer medium 606 by receiver 604. Receiver 604 incorporates a decoder operable to reverse the run length limit encoding performed in transmitter 602.

Figure 7:
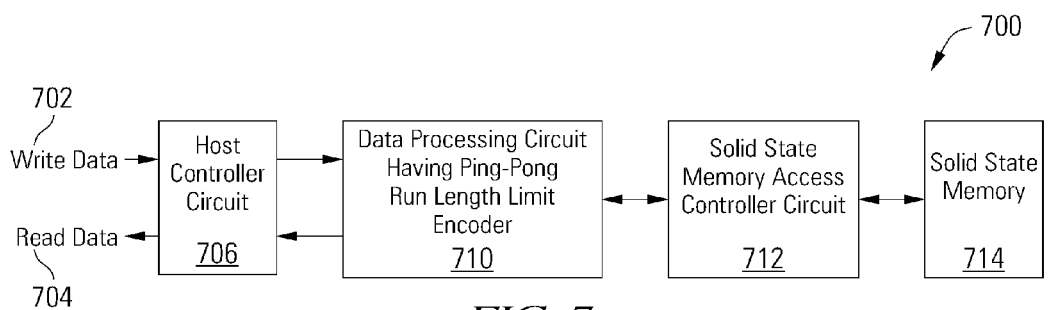
FIG. 7 depicts another storage system including a data processing circuit having a ping-pong run length limit encoder in accordance with some embodiments of the present invention.

Turning to FIG. 7, another storage system 700 is shown that includes a data processing circuit 710 having a ping-pong run length limit encoder in accordance with one or more embodiments of the present invention. A host controller circuit 706 receives data to be stored (i.e., write data 702). This data is provided to data processing circuit 710 where it is encoded using a ping-pong run length limit encoder. Such run length limit encoding can be implemented consistent with the disclosure above in relation to FIGS. 1-3. In some embodiments, the run length limit encoding can be performed consistent with a process disclosed above in relation to FIG. 4. The encoded data can be further processed or encoded as desired. The encoded data is provided to a solid state memory access controller circuit 712. Solid state memory access controller circuit 712 can be any circuit known in the art that is capable of controlling access to and from a solid state memory. Solid state memory access controller circuit 712 formats the received encoded data for transfer to a solid state memory 714. Solid state memory 714 can be any solid state memory known in the art. In some embodiments of the present invention, solid state memory 714 is a flash memory. Later, when the previously written data is to be accessed from solid state memory 714, solid state memory access controller circuit 712 requests the data from solid state memory 714 and provides the requested data to data processing circuit 710. In turn, data processing circuit 710 decodes the received data, reversing the run length limit encoding.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, embodiments of the present invention provide novel systems, devices, methods and arrangements for ping-pong run length limit encoding. While detailed descriptions of one or more embodiments of the invention have been given above, various alternatives, modifications, and equivalents will be apparent to those skilled in the art without varying from the spirit of the invention. Therefore, the above description should not be taken as limiting the scope of embodiments of the invention which are encompassed by the appended claims.

What is claimed is:
1. A storage system comprising:
 a data input;
 a run length limit encoder connected to the data input, the run length limit encoder comprising a subdivided threshold lookup table including a plurality of subordinate threshold lookup tables, each indexed by a different iteration number; and
 a storage medium connected to a data output of the run length limit encoder.
2. The storage system of claim 1, wherein the run length limit encoder comprises a plurality of one bit encoding processors connected in series.

3. The storage system of claim 1, wherein the plurality of subordinate threshold lookup tables are indexed by a range of consecutive iteration numbers.

4. The storage system of claim 1, wherein the plurality of subordinate threshold lookup tables are further indexed by an encoding level.

5. The storage system of claim 4, wherein the run length limit encoder is operable to update the encoding level based on an input data bit.

6. The storage system of claim 1, wherein the run length limit encoder comprises a plurality of encoding engines sharing the subdivided threshold lookup table.

7. The storage system of claim 6, wherein the run length limit encoder comprising a synchronization circuit operable to cause the plurality of encoding engines to access the subdivided threshold lookup table with a same iteration number.

8. The storage system of claim 7, wherein the synchronization circuit is operable to withhold input data from at least one of the plurality of encoding engines when said at least one of the plurality of encoding engines has a different iteration number from another of the plurality of encoding engines.

9. The storage system of claim 7, wherein one of the plurality of encoding engines and a corresponding one of the subordinate threshold lookup tables are operable to generate a parity bit in an encoded output.

10. The storage system of claim 7, wherein the synchronization circuit is operable to temporarily stall at least one of the plurality of encoding engines to prevent the plurality of encoding engines from operating with different iteration numbers.

11. The storage system of claim 7, wherein the synchronization circuit is operable to determine which of the plurality of encoding engines to stall when at different iteration numbers to yield a lowest restart latency before the plurality of encoding engines are at the same iteration number.

12. The storage system of claim 7, wherein the plurality of encoding engines each operate at a fraction of a data rate at the data input, and wherein the plurality of encoding engines operate together at least at the data rate at the data input.

13. A method for encoding data, comprising:
concurrently encoding a plurality of input data blocks in a plurality of run length limit encoder circuits operable to apply a multi-level enumerative encoding algorithm, wherein the plurality of run length limit encoder circuits share a threshold lookup table;
controlling a common iteration number provided as an index to the threshold lookup table; and
when an iteration number of one of the run length limit encoder circuits is different from an iteration number of another of the run length limit encoder circuits, stalling at least one of the run length limit encoder circuits until the iteration numbers are equal.

14. The method of claim 13, further comprising restarting said at least one of the run length limit encoder circuits when the iteration numbers are equal.

15. The method of claim 13, further comprising determining which of the run length limit encoder circuits to reduce a restart latency.

16. The method of claim 13, further comprising controlling an input memory for each of the run length limit encoder circuits, wherein the run length limit encoder circuits are stalled at least in part by stopping an output of the input memories.

17. The method of claim 13, further comprising tracking a drum point for stalled run length limit encoder circuits and restarting the stalled run length limit encoder circuits when the common iteration number matches the drum point.

18. A run length limit encoder comprising:
a plurality of encoder engine circuits each comprising a plurality of one bit processors operable to update an encoding level and to output an encoded data bit based at least in part on a previous encoding level and on an input data bit; and
a subdivided threshold lookup table comprising a subordinate threshold lookup tables for each set of corresponding ones of the plurality of one bit processors, operable to yield a threshold to the plurality of one bit processors based on the encoding level and on an iteration number.

19. The run length limit encoder of claim 18, further comprising a synchronization circuit operable to cause the plurality of encoder engine circuits to access the subdivided threshold lookup table with a common iteration number.

20. The run length limit encoder of claim 19, wherein the synchronization circuit is further operable to stall at least one of the plurality of encoder engine circuits when the plurality of encoder engine circuits are at different iteration numbers.

* * * * *